United States Patent
Mehta et al.

(10) Patent No.: US 10,453,547 B2
(45) Date of Patent: Oct. 22, 2019

(54) MONITORING A MEMORY FOR RETIREMENT

(71) Applicant: Seagate Technology LLC

(72) Inventors: Darshana H. Mehta, Shakopee, MN (US); Antoine Khoueir, Shakopee, MN (US); Ara Patapoutian, Shrewsbury, MA (US)

(73) Assignee: Seagate Technologies LLC, Cupertino, CA (US)

( * ) Notice: Subject to any disclaimer, the term of this patent is extended or adjusted under 35 U.S.C. 154(b) by 0 days.

(21) Appl. No.: 15/625,313

(22) Filed: Jun. 16, 2017

(65) Prior Publication Data

US 2018/0366209 A1    Dec. 20, 2018

(51) Int. Cl.
| | |
|---|---|
| G11C 29/00 | (2006.01) |
| G11C 29/10 | (2006.01) |
| G11C 29/30 | (2006.01) |
| G11C 29/42 | (2006.01) |
| G06F 12/02 | (2006.01) |
| G06F 3/06 | (2006.01) |
| G11C 29/44 | (2006.01) |
| G11C 29/52 | (2006.01) |
| G11C 29/32 | (2006.01) |

(52) U.S. Cl.
CPC .......... G11C 29/10 (2013.01); G06F 3/0653 (2013.01); G06F 3/0685 (2013.01); G06F 12/0253 (2013.01); G11C 29/30 (2013.01); G11C 29/42 (2013.01); G11C 29/44 (2013.01); G11C 29/52 (2013.01); *G06F 2212/702* (2013.01); *G11C 29/32* (2013.01)

(58) Field of Classification Search
CPC ......... G11C 29/10; G11C 29/30; G11C 29/42; G11C 29/32; G06F 12/0253; G06F 3/0685; G06F 3/0653
See application file for complete search history.

(56) References Cited

U.S. PATENT DOCUMENTS

| | | |
|---|---|---|
| 2011/0173484 A1* | 7/2011 | Schuette ............. G06F 11/0727 714/2 |
| 2012/0311381 A1 | 12/2012 | Porterfield |
| 2013/0094288 A1 | 4/2013 | Patapoutian et al. |
| 2013/0238839 A1 | 9/2013 | Weingerten et al. |
| 2013/0262960 A1 | 10/2013 | Schuette et al. |
| 2014/0006847 A1 | 1/2014 | Guo et al. |
| 2014/0156916 A1 | 6/2014 | Aken |
| 2014/0347936 A1 | 11/2014 | Ghaly |

(Continued)

*Primary Examiner* — Samir W Rizk
(74) *Attorney, Agent, or Firm* — Fisher Broyles LLP; Gregory T. Fettig

(57) ABSTRACT

Systems and methods presented herein provide for monitoring block, page, and/or stripe degradation. In one embodiment, a controller is operable to scan a first block of memory to identify a failure in a portion of the first block. The controller suspends input/output (I/O) operations to the failed portion of the first block, and tests the failed portion of the first block to determine if the failure is a transient failure. Testing includes loading the portion of the first block with data, and reading the data from the loaded portion of the first block. If the failure subsides after testing, the controller is further operable to determine that the failure is a transient failure, and to resume I/O operations to the portion of the first block.

17 Claims, 10 Drawing Sheets

(56) References Cited

U.S. PATENT DOCUMENTS

| | | |
|---|---|---|
| 2015/0127973 A1 | 5/2015 | Porterfield |
| 2015/0149818 A1 | 5/2015 | Kalavade et al. |
| 2015/0169237 A1 | 6/2015 | Ioannou et al. |
| 2015/0254178 A1 | 9/2015 | Aken |
| 2015/0309872 A1* | 10/2015 | Cai .................... G06F 11/1024 714/764 |
| 2016/0093386 A1 | 3/2016 | Shur et al. |
| 2016/0283111 A1 | 9/2016 | Guo et al. |
| 2017/0116070 A1* | 4/2017 | Alrod ................. G06F 11/0793 |

* cited by examiner

MONITORING A MEMORY FOR RETIREMENT

BACKGROUND

Some data storage devices, such as Solid State Drives (SSDs), do not employ moving mechanical components like a Hard Disk Drive (HDD) does. For example, some storage devices use integrated circuitry as memory cells to persistently store data. The memory cells are arranged in "pages", which are arranged in "blocks". And, the blocks are arranged on a "plane" of a die. Typically, if a block consistently fails during a program, erase, or read operation, then the entire block is retired and removed from an available memory pool. For example, memory cells are prone to failures the more they are used. The cells are typically designed to handle many thousands of read/writes before a failure occurs. However, over time, the reads/writes wear out the oxide layer of the floating gates of the cells, destroying the cell's ability to store data. Once the memory cells of a block fail, then the block is removed from the available memory pool of the storage device, even if portions of the block are still usable.

SUMMARY

Systems and methods presented herein provide for monitoring block, page, and/or stripe degradation. In one embodiment, a controller is operable to scan a first block of memory to identify a failure in a portion of the first block. The controller is also operable to suspend input/output (I/O) operations to the failed portion of the first block, and to test the failed portion of the first block to determine if the failure is a transient failure. Testing entails loading the portion of the first block with data, and reading the data from the loaded portion of the first block (e.g., with an error correction code (ECC)). If the failure subsides after testing, the controller determines that the failure is a transient failure resumes I/O operations to the portion of the first block.

The various embodiments disclosed herein may be implemented in a variety of ways as a matter of design choice. For example, the system and method embodiments hereof may take the form of computer hardware, software, firmware, or combinations thereof. Other exemplary embodiments are described below.

BRIEF DESCRIPTION OF THE FIGURES

Some embodiments are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments. It will thus be appreciated that those skilled in the art will be able to devise various arrangements that, although not explicitly described or shown herein, embody certain principles that are included within the scope of the embodiments. Furthermore, any examples described herein are intended to aid in understanding the principles of the embodiments and are to be construed as being without limitation to such specifically recited examples and conditions. As a result, the embodiments are not limited to any specific examples described below.

Figure 1:
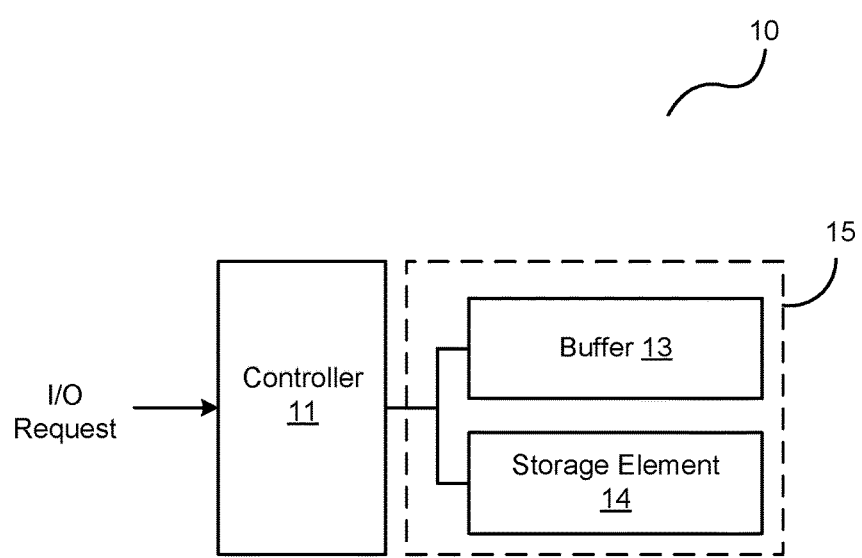
FIG. 1 is a block diagram of an exemplary storage system that handles writing when blocks are open.

FIG. 1 is a block diagram of an exemplary storage system 10 that is operable to store data resulting from I/O requests from a host system (shown below). The storage system 10 comprises a storage device 15 further comprising a storage element 14 (e.g., a non-volatile NAND flash device or other persistent storage storage) and an optional buffer 13 (e.g., Dynamic Random Access Memory, or "DRAM", for caching, staging, etc.). For example, the storage element 14 may be configured using one or more SSD architectures, such as Single Level Cell (SLC) architectures and Multi-Level Cell (MLC) architectures. An SLC architecture allows a memory cell to store one bit of data. Traditionally, an MLC architecture meant that a memory cell could store two bits of data. But, architectures have evolved and now provide even higher levels of density, such as Triple Level Cell (TLC) architectures that store three bits per memory cell, and Quad Level Cell (QLC) architectures that store four bits per memory cell. Generally, though, any architecture storing more than one bit of data per cell may also be referred to as an MLC architecture.

Each memory cell of the storage element 14 may be configured like a Metal Oxide Semiconductor Field Effect Transistor (MOSFET) with a control gate. But, each memory cell also has a floating gate surrounded by an insulating oxide layer configured between the control gate and the channel of the MOSFET. Because the floating gate is electrically isolated by its insulating layer, electrons placed on it are trapped until they are removed by an application of an electric field (e.g., an applied voltage). Placing electrons on the floating gate sets the transistor to the logical "0" state. Once the floating gate is charged, the electrons in it screen the electric field from the control gate, thereby increasing the threshold voltage of the memory cell. This means that a higher voltage is applied to the control gate to make the channel of the transistor conductive.

In order to write a value from the transistor, an intermediate voltage between the threshold voltages is applied to the control gate. If the channel conducts at this intermediate voltage, the floating gate is uncharged and causes a logical "1" to be stored in the memory cell. If the channel does not conduct at the intermediate voltage, it indicates that the floating gate is charged causing a logical "0" to be stored in the memory cell. The presence of a logical "0" or a logical "1" is sensed, or "read", by determining whether there is current flowing through the transistor when the intermediate voltage is asserted on the control gate.

Regardless of the architecture (e.g., SLC, MLC, magnetoresistive, or combination thereof), memory cells are generally arranged in pages typically comprising thousands of cells in a single page. For example, a single page of an SLC flash device may comprise 16,384 memory cells capable of storing 16,384 bits of data, or 16 kilobytes (kB). A single page of a 2-bit MLC flash device may comprise 8,192 memory cells capable of storing the same amount of data.

Typical page sizes include 2 kB, 4 kB, 8 kB, and 16 kB. The pages of a flash device are arranged in blocks with each block routinely comprising 128 or 256 pages. Thus, each block in a flash device can vary between 256 kB and 4 megabytes (MB). When data is to be written to a flash device, a controller 11 programs the device on a page-by-page basis until a block is full. Once the block of a flash device is full, the block is closed until the controller 11 performs an erasure process on the block. However, it should be noted that the embodiment is not intended to be limited to any page size or block size as these features are constantly changing as the technology progresses.

Based on the foregoing, the controller 11 is any device, system, software, firmware, or combination thereof operable to service I/O requests to read data from and write data to the storage device 15. The storage element 14 is any device comprising memory operable to persistently store one or more bits of data.

Figure 2:
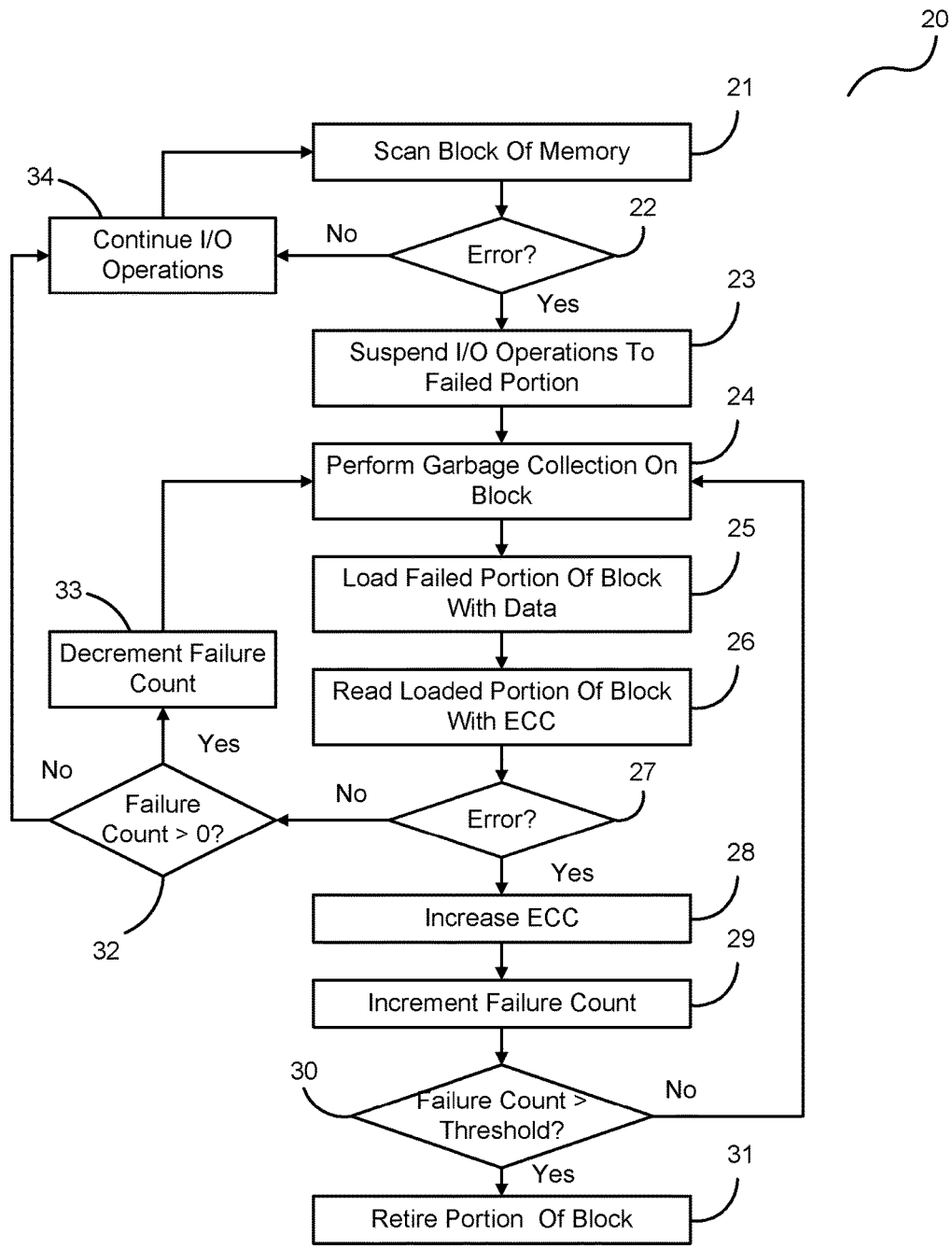
FIG. 2 is a flowchart of an exemplary process of the storage system of FIG. 1.

FIG. 2 is a flowchart of an exemplary process 20 of the storage system 10 of FIG. 1. In this embodiment, the controller 11 is operable to scan a block of memory in the storage element 14, in the process element 21, to determine if there is an error in some portion of the block (e.g., one or more cells, one or more pages of the block, the entire block itself, etc.), in the process element 22. For example, the controller 11 may read data from the memory of the block using a standard ECC during a background scan process to determine whether any errors exist that cannot be corrected with the ECC.

If errors do exist, the controller 11 suspends I/O operations to the failed portion of the block, in the process element 23. While the portion of the block is suspended, the controller 11 may begin testing that portion of the block by first performing a garbage collection on the block, in the process element 24. For example, the controller 11 may move an unerased portion of the blocks that is no longer in use. A background task by the controller 11 then erases the portion of the block.

Afterwards, the controller 11 loads the failed portion of the block with data, in the process element 25, and reads the freshly loaded portion of a block with the ECC, in the process element 26. For example, the controller 11 may load test data into the portions of the block. This test data, being known, may be read with the ECC and then compared to the data that was originally loaded into the portions of the block to determine whether any error still exists, in the process element 27.

Alternatively, the controller 11 data coming from actual I/O's. For example, the controller 11 may process an I/O request and cache the data of the I/O request in the buffer 13 until the data can be stored somewhere in the storage system 10. The controller 11 may use this data and load it into the suspended portion of the block. The controller 11 may then read back that data using the ECC and compare it to the data in the buffer 13 to determine whether any errors still exist, in the process element 27.

If errors still exist, the controller 11 may then increase the ECC (e.g., increase the code rate), in the process element 28, and increment a failure count of that portion of the block, in the process element 29. For example, this testing process may be iterative in nature. And, the controller 11 is operable to count the number of times that portion of the block fails to correctly read data. In this regard, the controller 11 may determine whether the failure count has breached a threshold number of failures, in the process element 30. If the portion of the block has not breached the threshold, the controller 11 performs another garbage collection on the block, in the process element 24, and the process continues as before. If, however, that portion the block reaches the threshold failure count, in the process element 30, the controller 11 retires that portion of the block, in the process element 31, such that no other I/Os may be directed to that portion of the block.

Returning to the process element 27, if no error exists after reading the loaded portion of the block, in the process element 26, then the controller 11 determines whether the aforementioned failure count is greater than zero, in the process element 32. Since the portion of the block has successfully passed a read, the controller 11 decrements the failure count, in the process element 33. If the failure count is still greater than zero, the controller 11 continues testing that portion of the block (e.g., garbage collecting, and loading and reading that portion of the block. Otherwise, if the failure count is equal to zero (or some other acceptable threshold), then the controller 11 returns that portion of the block to the memory pool of the storage system 10. That is, the controller 11 returns that portion a block from suspension such that I/O operations to that portion of the block can continue, in the process element 34. The controller 11 then continues to periodically scan that previously failed portion of the block, as well as other blocks in the storage element 14.

It should also be noted that the I/O requests can and often do come directly from a host system. However, I/O requests may be cached in another device before arriving at the storage system 10. For example, the I/O requests may be cached within the buffer 13 before being executed, or may even be issued by other storage devices themselves. Accordingly, the embodiment is not intended to be limited to any particular type of I/O request.

Figure 3:
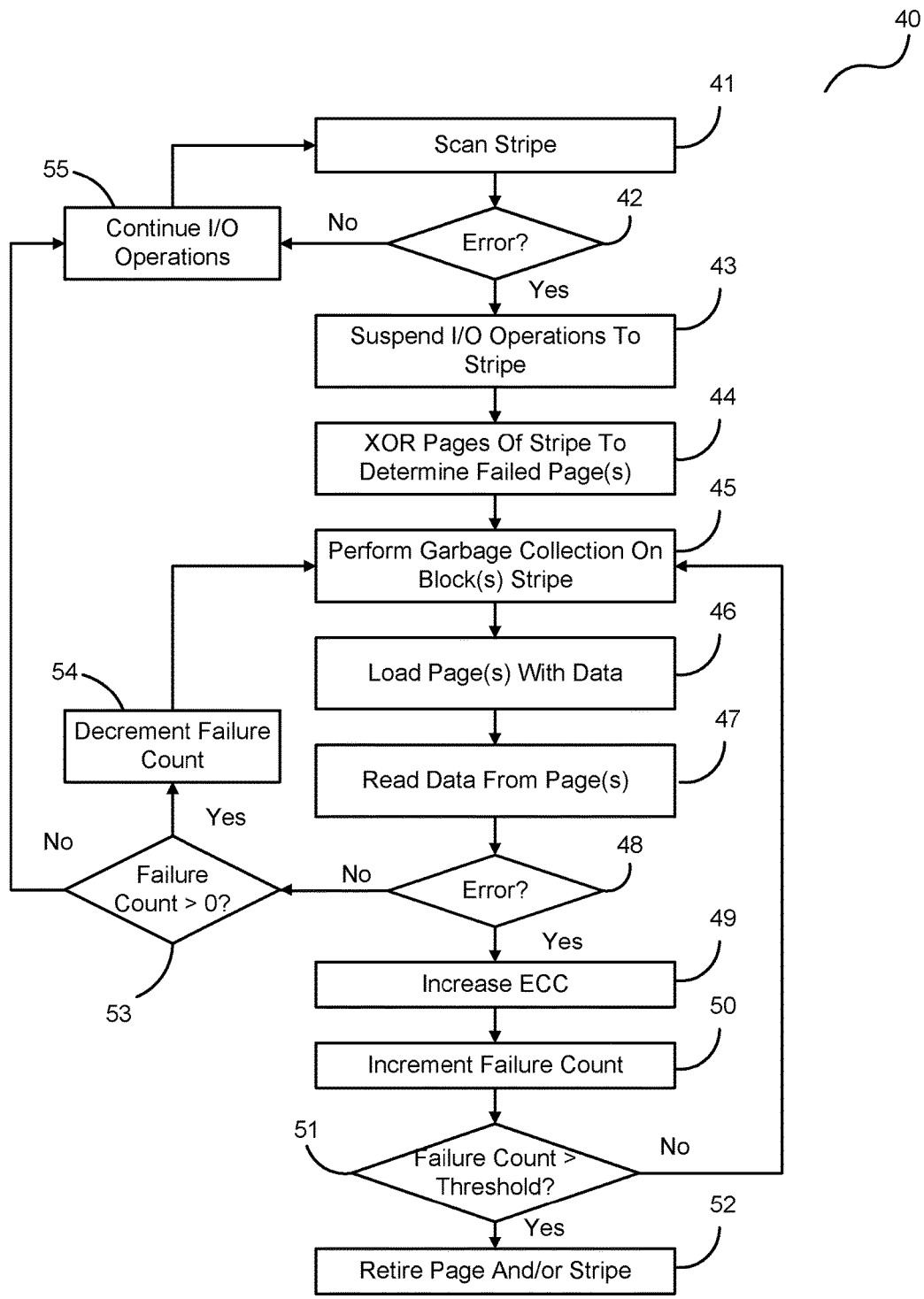
FIG. 3 is flowchart of another exemplary process of the storage system of FIG. 1.
Figure 4:
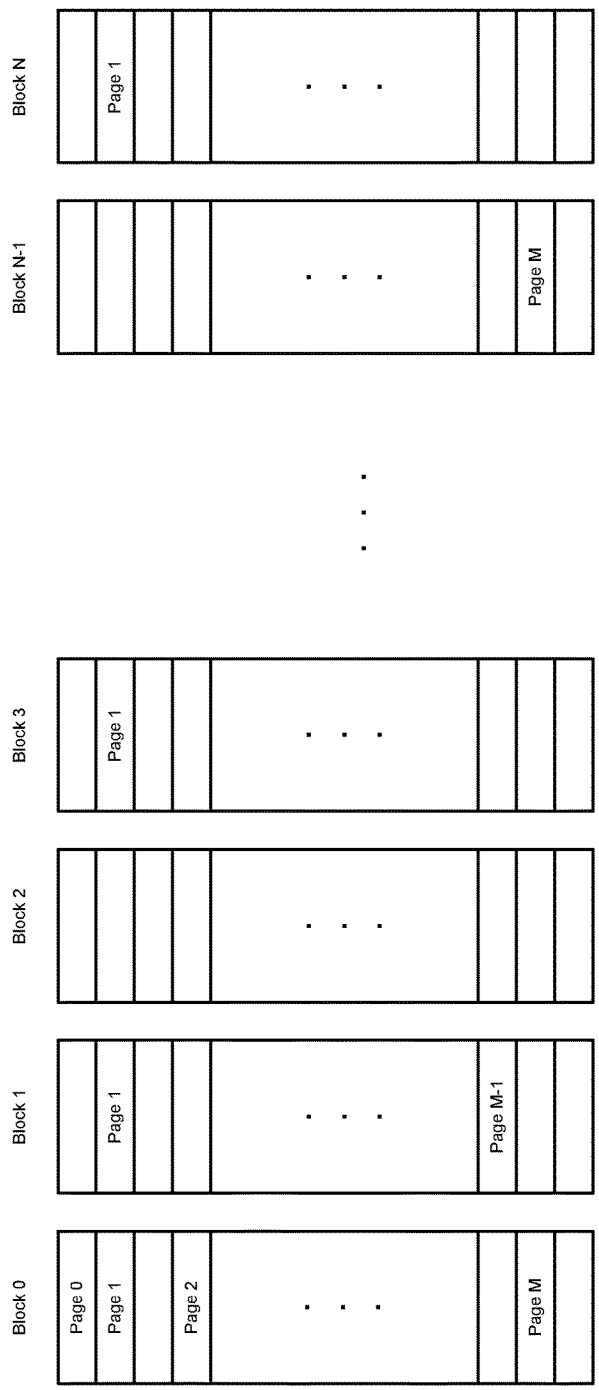
FIG. 4 is a diagram of an exemplary block layout of a storage system.
Figure 5:
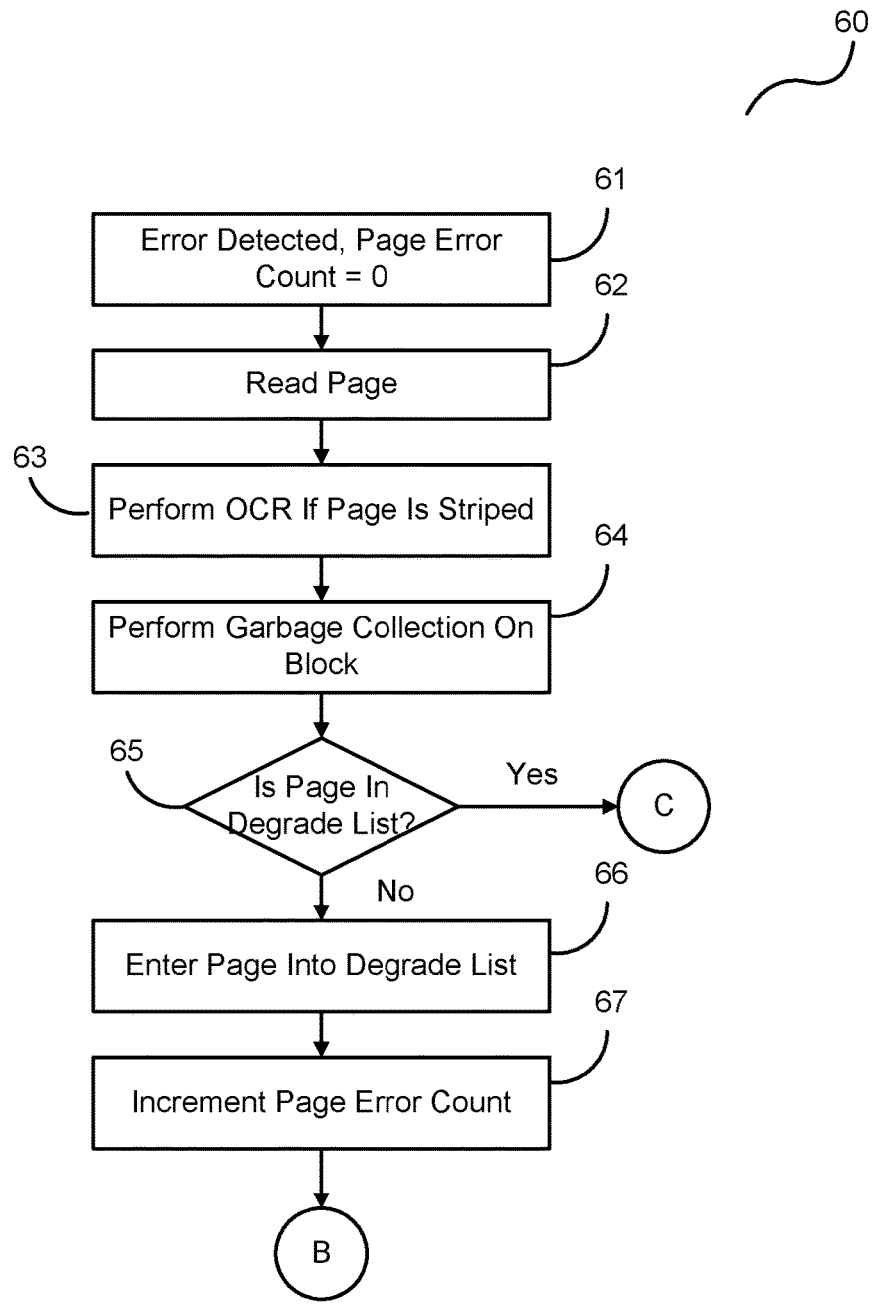
FIGS. 5-8 are flowcharts of another exemplary process of the storage system of FIG. 1.

FIG. 3 is flowchart of another exemplary process 40 of the storage system 10. In this embodiment, the storage system 10 has a stripe configuration similar to that of Redundant Array of Independent Disks (RAID) system. In this regard, a page of data may be programmed/duplicated in multiple blocks of the storage element 14. For example, FIG. 4 illustrates blocks "0" through "N" that may reside in the storage element 14 (where "N" is merely intended to represent an integer greater than "1" and not necessarily equal to any other "N" reference designated herein). The blocks comprise pages 0-M (where "M" is merely intended to represent an integer greater than "1" and not necessarily equal to any other "M" reference designated herein). But, in this instance, the pages are striped across the blocks "0" through "N". To illustrate, blocks 0, 1, 3, and N each comprise page "1". Each page "1" is a duplicate of the data of the other page "1"s in the blocks. That is, page "1" of block "0" comprises the same data of the page "1" of block "1", which comprises the same data of the page "1" of block "3", and so on.

With this in mind, the controller 11 scans a stripe, in the process element 41. The controller 11 then determines whether an error exists in the read stripe, in the process element 42. If an error exists in the stripe, the controller 11 then suspends I/O operations to that stripe, in the process element 43, and the controller 11 may XOR the pages of the stripe to determine the failed page(s) of the stripe, in the process element 44. For example, assume that page "1" of block "0" has an error and that the remaining page "1s" of the blocks 1, 3, and N have good data. The controller 11 may XOR the blocks with one another to locate the error in page "1" of block "0". Alternatively or additionally, the controller 11 may use some other technique to recover data (e.g., Reed Solomon, ECC, or the like).

Once the failing page(s) have been located, the controller 11 performs garbage collection on the blocks of the stripe, in the process element 45. For example, the controller 11 may erase the failing pages. Then, the controller 11 may load the pages with data (e.g., test data or actual data as similarly described above), in the process element 46. The controller 11 then reads the data from the pages using an ECC, in the process element 47, and then determines if an error still exists in the page(s), in the process element 48. If the error still exists, then the controller 11 increases the ECC and increments a failure count, in the process elements 49 and 50, as similarly described above.

If the failure count is greater than some threshold number of failures, in the process element 51, then the controller 11 retires the failed page(s). If it is determined that all of the pages of failed a number of times greater than the threshold, then the controller 11 may retire the entire stripe. If however, the failure count is less than the threshold number of failures, then the controller 11 continues testing the failed page(s) (e.g., performing garbage collection on the block(s) of the stripe, loading the pages with data, and reading the pages with ECC).

Returning to the process element 48, if no error had occurred after testing the failed page, then the controller 11 determines whether the failure count is greater than zero (or some other acceptable threshold number), in the process element 53. If the failure count is greater than zero, the controller 11 decrements a failure count, in the process element 54, and then continues testing of the failed page(s) of the stripe (e.g., garbage collecting the block(s), and loading and reading the pages of the stripe). Otherwise, the controller 11 removes the stripe from suspension such that I/O operations can be continued to the stripe, in the process element 55. And, the controller 11 continues to scan the stripe as well as other stripes within the storage element 14 (e.g., as part of a background scan process).

It should be noted that the process embodiments herein are exemplary and not intended to be limiting. The process elements thereof may be rearranged or changed while still embodying the principles of memory suspension and/or retirement disclosed herein.

FIGS. 5-8 are flowcharts of another exemplary process 60 of the storage system 10 of FIG. 1. For example, each figure of FIGS. 5-8 represents a portion of the process 60 in which the controller 11 performs page, stripe, and/or block suspension and/or retirement. The process 60 begins in FIG. 5 with the process element 61 in which the controller 11 monitors a page of a block and detects an error in the page. The controller 11 reads the page, in the process element 62, and if the page is striped across a plurality of blocks, then the controller 11 may perform an OCR on the page, in the process element 63. For example, the controller 11 may XOR the page with other pages (or some other form of data recover, such as Reed Solomon, ECC, etc.) in the stripe to determine whether one or more of the pages in the stripe have failed.

Figure 6:
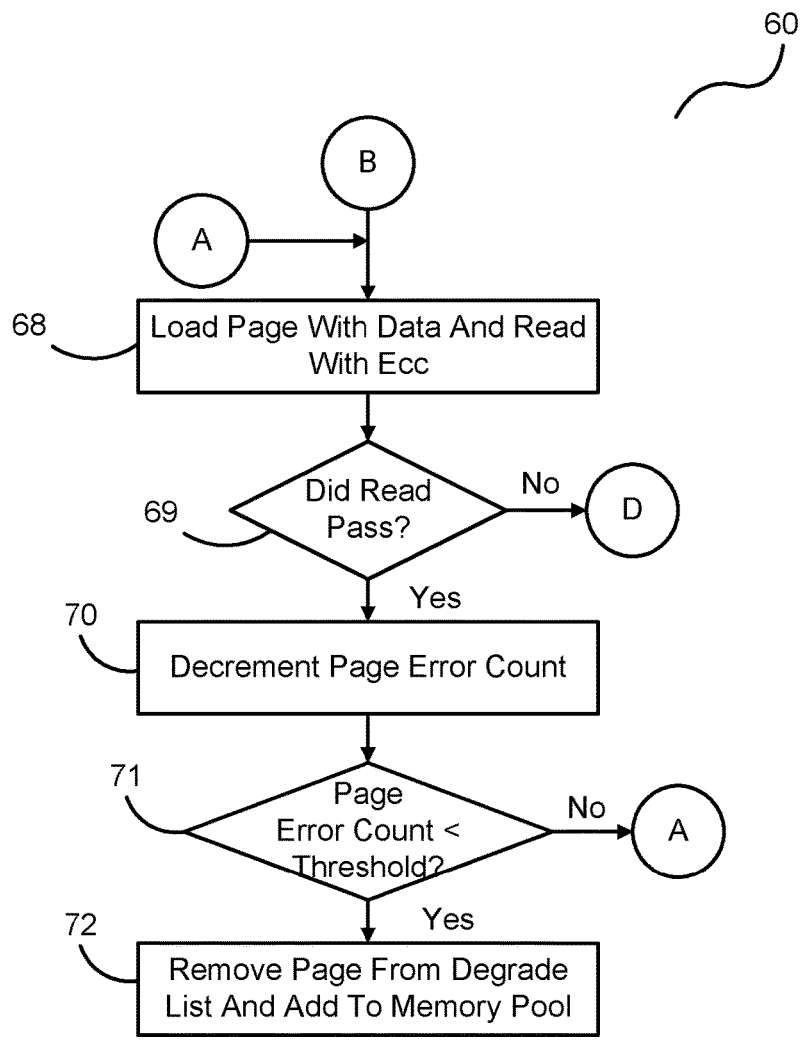

After the OCR is performed, the controller 11 performs garbage collection on the block, in the process element 64, and then determines whether the page is in a degrade list, in the process element 65. For example, if the controller 11 had previously detected an error in the page, the controller 11 may have placed that page in suspension. Thus, if the page is not currently in suspension, then the controller 11 enters the page into a degrade list, in the process element 66. In this degrade list, the page may still be able to take on data from I/O operations. The controller 11 then increments a page error count, in the process element 67, and moves on to analysis of the page, as illustrated in FIG. 6, via the process element "B". If, however, the page is currently in a degrade list, the controller 11 moves straight to testing the failed page, as illustrated in FIG. 7, via the process element "C".

Returning to FIG. 6, the controller 11 initiates testing on the page by loading data into the page and reading the data with an ECC, in the process element 68. The controller 11 then determines whether the degraded page that has just been read has passed or not, in the process element 69. If the degraded page contained an error during the read with the ECC, the controller 11 moves straight to testing the failed page, as illustrated in FIG. 7, via the process element "D". Otherwise, the degraded page passed the read with the ECC and the controller 11 decrements its page error count, in the process element 70. Then, if the page error count is less than some threshold, in the process element 71, the controller 11 removes the page from the degrade list and continues with I/O operations, in the process element 72, as the error in the page was deemed to be transient in nature. The controller 11 then continues monitoring the page as well as other pages in the block during background scan operations. If the page error count is greater than the threshold, however, the page may have been subject to multiple transient errors. And, the controller 11 may continue performing the load/read operation of the process element 68 to continue checking on the page to see if the error count decreases, via the process element "A".

Figure 7:
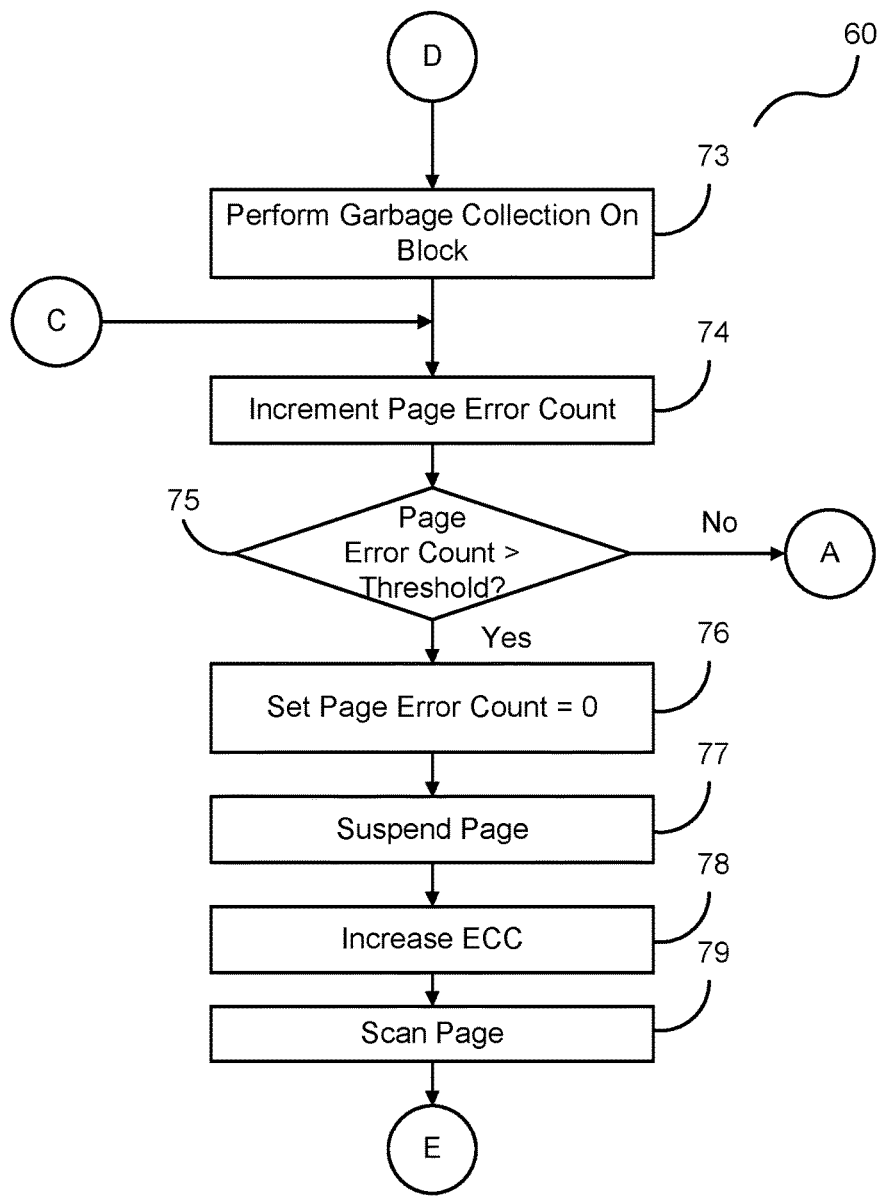

Again, if the degraded page did not pass the read operation (e.g., if there is a failure in reading the page in the process element 69), the controller 11 moves straight into testing the failed page, as illustrated in FIG. 7, via the process element "D". In this embodiment, the controller 11 performs garbage collection on the block, in the process element 73, and then increments the page error count, in the process element 74. The controller 11 determines whether the page error count is greater than some threshold, in the process element 75. If not, the controller 11 attempts to retry the page by loading/reading it, as illustrated in FIG. 6, via the process element "A". However, if the page error count is greater than the threshold, then the controller 11 sets the pager count equal to zero, in the process element 76, and suspends the page from subsequent I/O operations, in the process element 76, thereby removing the page from the memory pool of the storage element 14.

Figure 8:
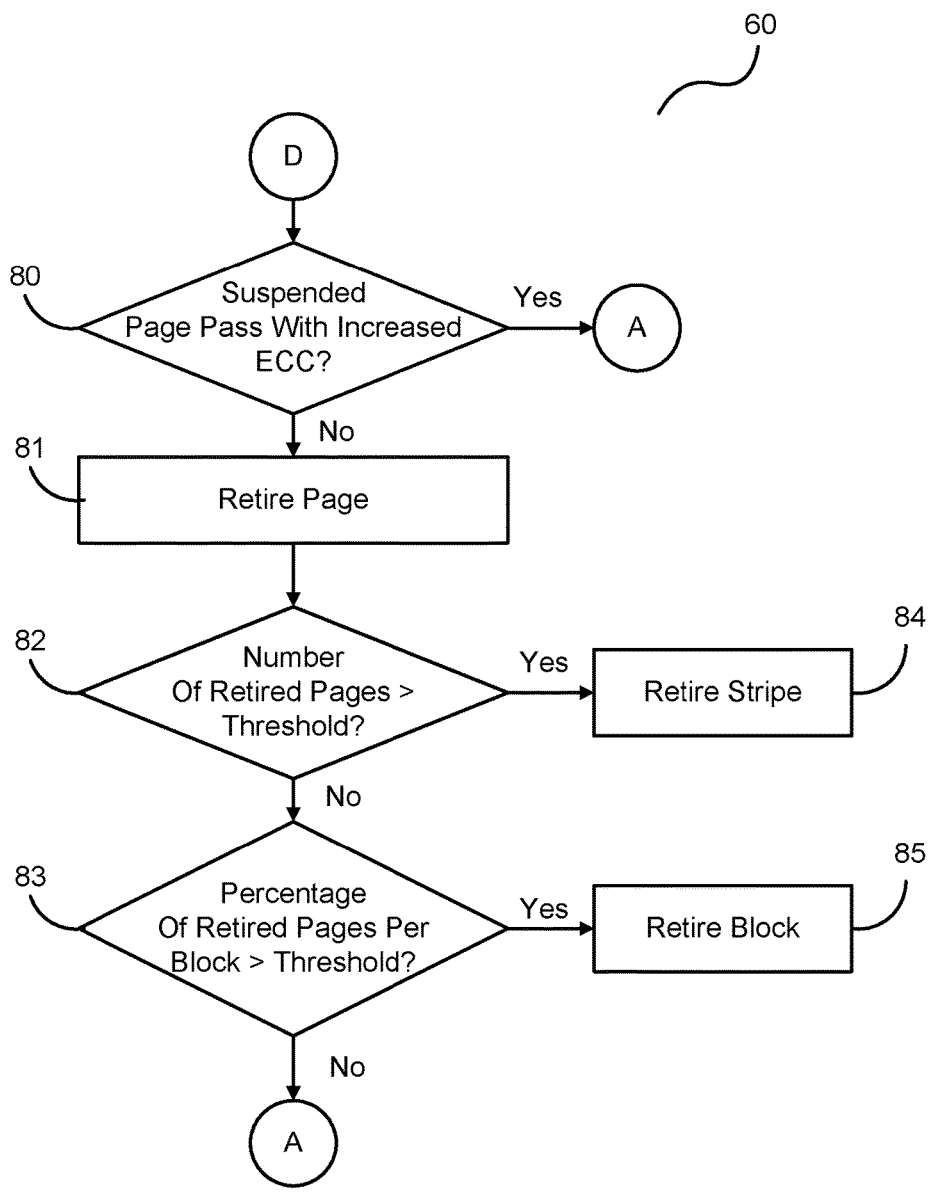

Once the page is in suspension, the controller 11 increases the ECC/code rate, in the process element 78. The controller 11 then scans the page for errors, in the process element 79. This may include loading the page with data and reading the data with the increased ECC. From there, a retirement evaluation is performed by the controller 11, as illustrated in FIG. 8, via the process element "E".

In this retirement evaluation, the controller 11 determines whether the suspended page passed with the increased ECC. If so, the controller 11 maintains the page in a degraded status but allows I/O operations to continue with increased ECC, loading and reading the page, as illustrated in FIG. 6, via the process element "A". If, however, the page still produced errors with the increased ECC, the controller 11 decides to retire the page, in the process element 81. From here, a stripe analysis is performed to determine whether the number of retired pages in a stripe has breached a threshold. For example, if the pages in a stripe cannot be recovered via XOR operations, the controller 11 retires the entire stripe, in the process element 84, thereby precluding I/O operations from being performed on the stripe.

If the number of retired pages in the stripe is less than the threshold number, the controller 11 determines whether the percentage of retired pages per block is greater than a threshold, in the process element 83. For example, if the majority of pages have failed and those pages are deemed inoperable even with increased ECC, the controller 11 retires the entire block, in the process element 85. If the percentage of retired pages per block is less than the threshold, the controller 11 keeps the pages in the degraded list and attempts to read them with the increased ECC, as illustrated in FIG. 6, via the process element "A".

Typically, when pages of a block were failing, the entire block was retired. In an embodiment where the storage element 14 is a flash device, this new approach to degrading and/or suspending pages allows blocks to survive, thereby increasing the longevity of the storage element 14 as well as increasing the amount of available memory of the storage element 14. Moreover, retiring an entire block generally requires a rebuild of an entire garbage collection, which can impact performance of the storage system 10. Retiring, or at least degrading, individual pages does not impact performance because the process is performed in the background as part of the typical scan process. And, by detecting a degrading page, the page can be retired prior to that page having an unrecoverable read error.

It should be noted that the embodiments disclosed herein are not intended to be limited to ECC and outer code recovery (OCR) techniques, such as XOR and Reed Solomon OCR techniques. For example, in a flash device, another recovery technique may include dithering (e.g., changing) the voltage reference threshold (Vref) to produce a more reliable result.

Figure 9:
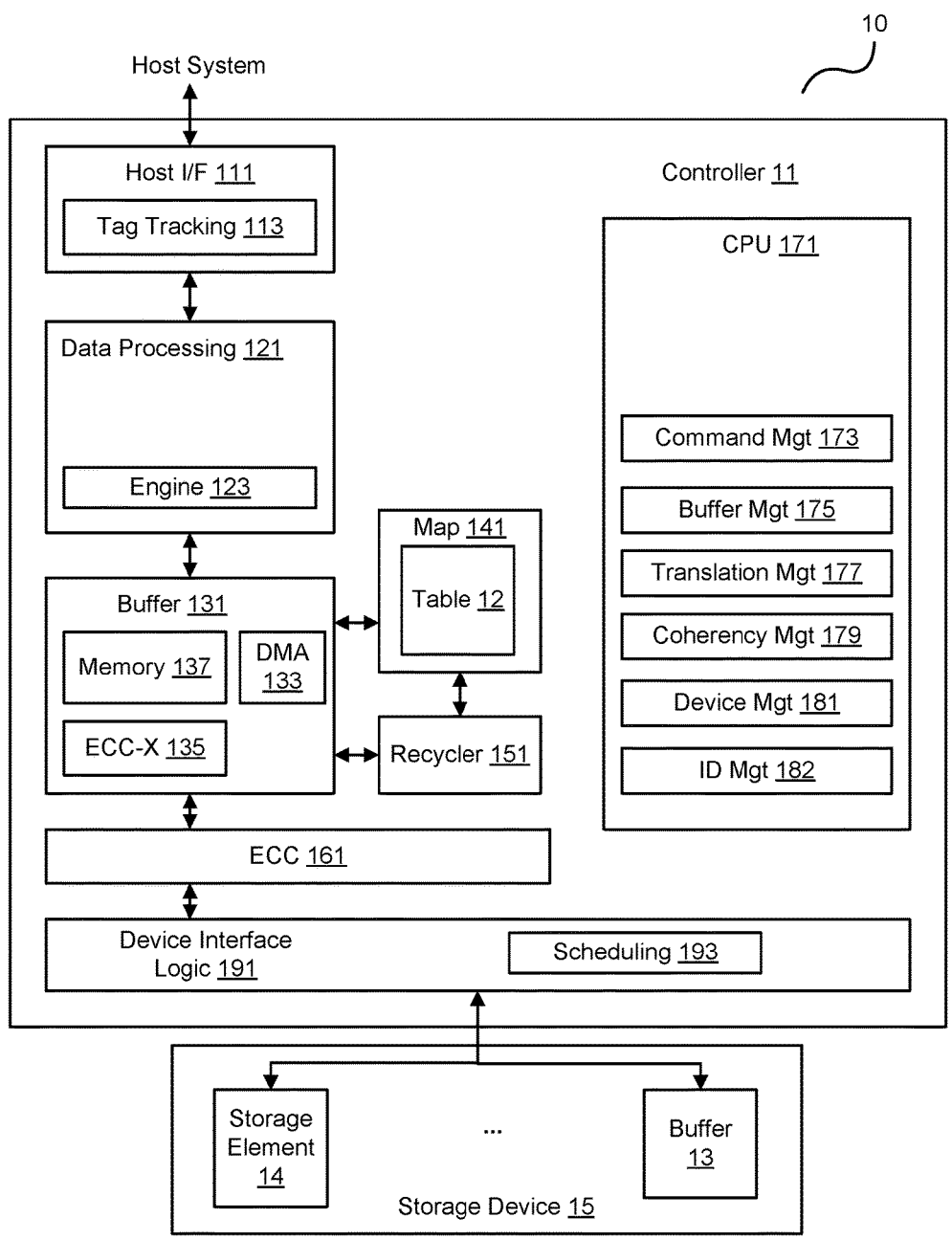
FIG. 9 is a block diagram of an exemplary storage controller and its associated storage device.
Figure 10:
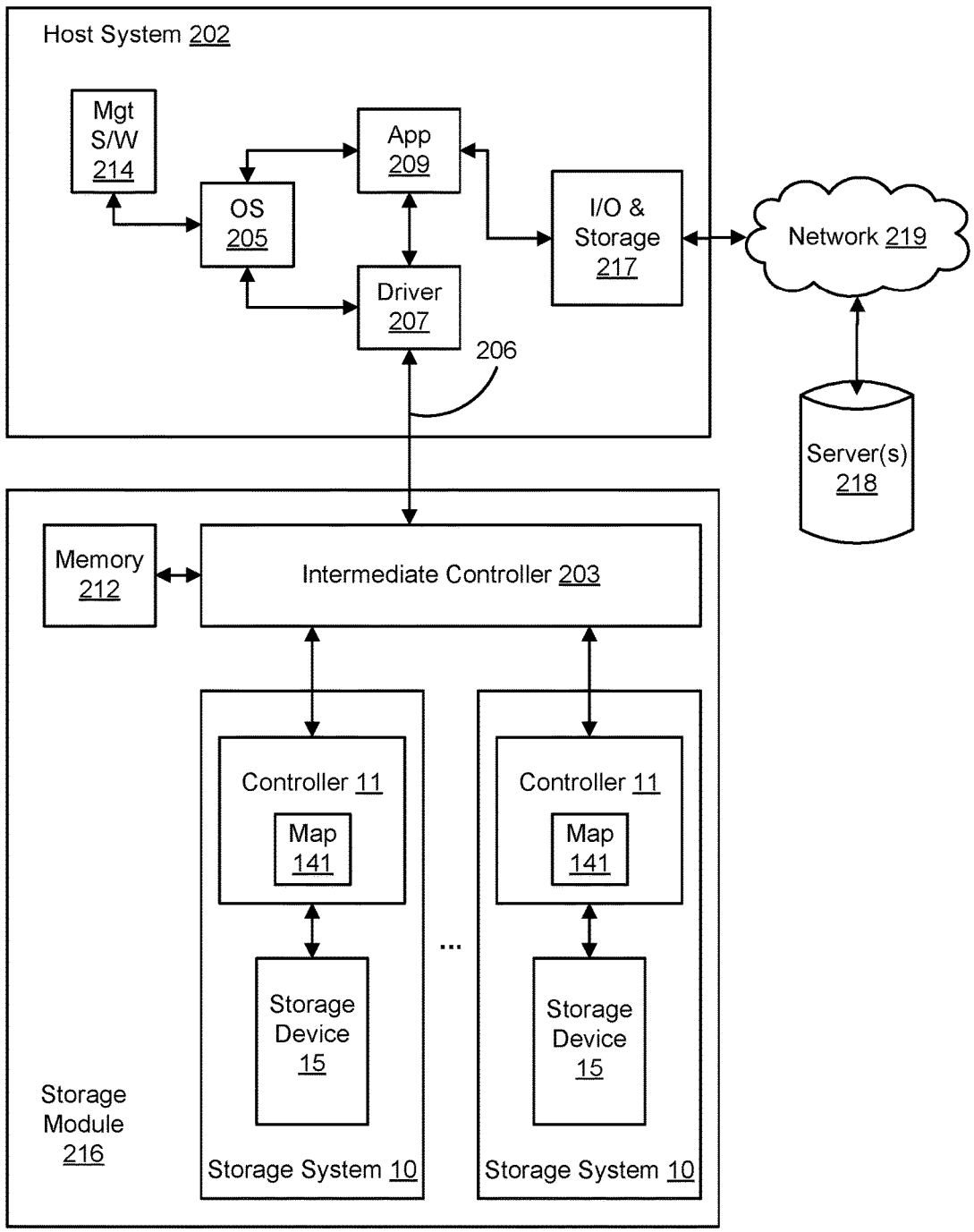
FIG. 10 is a block diagram of an I/O module comprising storage devices and their associated controllers interfacing with a host system.

The embodiments herein can take the form of hardware, firmware, software, or a combination thereof. FIGS. 9 and 10 illustrate such a combination that may be operable to employ the systems and methods described herein. More specifically, FIG. 9 is a block diagram of an exemplary storage system 10 and its associated device controller (e.g., the controller 11) and storage device 15 (e.g., the storage element 14 and the buffer 13 of FIG. 1). FIG. 10 is a block diagram of a storage module 216 comprising storage systems 10 and their associated controllers 11/storage devices 15 interfacing with a host system 502.

In FIG. 9, the controller 11 includes a host interface 111 that is operable to interface with a host system to communicate I/O operations of the host system. The host interface 111 may be configured with a tag tracking module 113 that is operable to track progress of individual I/O commands (e.g., read and write commands to certain addresses in the storage device 15). The tag tracking module 113 may associate an external flag of a command received from the host system with an internal flag that the controller 11 can access during processing of the command to identify the status of the processing.

The controller 11 also includes a data processing module 121 that comprises a processing engine 123 generally operable to perform certain tasks on data that is received from the host interface 111 or residing within a buffer 131, such as one or more of formatting the data, transcoding the data, compressing the data, decompressing the data, encrypting the data, decrypting the data, data encoding/formatting, or any combination thereof. For example, a processing engine 123 of the data processing module 121 may be operable to process the I/O operation from an I/O module of the host system generating the operation, such that the data of the I/O operation may be written to the logical address of the storage device 15. The processing engine 123 may extract the data of the write I/O command and prepare it for storage in the storage device 15. In doing so, the processing engine 123 may compress the data using any of a variety of data compression algorithms. When retrieving the data from the storage device 15, the processing engine 123 may decompress the data according to the algorithm used to compress the data for storage.

The buffer 131 is operable to store data transferred to and from the host system. The buffer 131 may also store system data, such as memory tables used by the controller 11 to manage the storage element 14, the buffer 13, and any possible higher-level RAID functionality in the memory 137. Other modules may include an error correcting code (ECC-X) module 135 to provide higher-level error correction and redundancy functionality, and a Direct Memory Access (DMA) module 133 to control movement of data to and from the buffer 131.

The controller 11 also includes an error correction code module 161 operable to provide lower level error correction and redundancy processing of the data in the buffer 131 using any of a variety of error correction codes techniques (e.g., cyclic redundancy checks, Hamming codes, low-density parity check coders, etc.).

A device interface logic module 191 is operable to transfer data to and from the storage device 15 according to the protocol of the devices therein. The device interface logic module 191 includes a scheduling module 193 that is operable to queue I/O operations to the storage device 15.

The controller 11 herein also includes a map module 141 that is operable to perform data addressing to locations in the storage device 15 according to the lookup table 12. For example, the map module 141 may use the lookup table 12 to convert logical block addresses (LBAs) from the host system to block/page addresses directed to the buffer 13, the storage element 14, or both. The lookup table 12 may be stored in whole or in part in controller 11 and/or in storage device 15. For example, in some embodiments a portion of the lookup table 12 may be cached in the controller 11 with generally all of lookup table 12 being stored non-volatilely in the storage device 15.

A recycler 151 performs garbage collection on behalf of the controller 11. For example, the recycler 151 may determine portions of the storage device 15 that are actively in use by scanning the lookup table 12 of the map module 141. In this regard, the recycler 151 may make unused, or "deallocated", portions of the storage device 15 available for writing by erasing the unused portions. The recycler 151 may also move data within the storage device 15 to make larger contiguous portions of the storage device 15 available for writing.

The controller 11 also includes a CPU 171 that controls various aspects of the controller 11. For example, the CPU 171 may process instructions or firmware to implement command management 173 that tracks and controls commands received from the host system. This firmware may also implement buffer management 175 that controls allocation and use of the buffer 131 and translation management 177 or to control the map module 141. The firmware may also employ coherency management 179 to control consistency of data addressing to avoid conflicts such as those that may occur between external data accesses and recycled data accesses. The firmware may also provide device management 181 to control the device interface logic module 191 and identity management 182 to control modification and communication of identity information of components within the controller 11.

In FIG. 10, the host system 202 is operable to process software instructions and perform I/O operations with the storage module 216 to read from and write to one or more storage systems 10. In this regard, the host system 202 may include an operating system 205 that provides the computing environment for the host system 202. A driver 207 is operable to communicate through the link 206 to the storage module 216 to perform the I/O operations with the various storage systems 10 configured therewith.

Like other computing systems, the operating system 205 may be initiated via management software 214 (e.g., Bios software). The host system 202 may also include application software 209 to perform various computing processes on behalf of the host system 202 (e.g., word processing applications, image processing applications, etc.). The host system 202 may also include I/O and storage functionality 217 operable to conduct I/O operations with one or more servers 218 through a communication network 219 (e.g., the Internet, local area networks, wide-area networks, etc.). In this regard, the storage module 216 may act as a cache memory of I/O operations for the host system 202.

The storage module 216 may be configured with an intermediate controller 203 that is operable to switch various I/O operations of the host system 202 to LBAs of the storage systems 10. In this regard, the storage module 216 may include a memory 212 that stores mapping information for the intermediate controller 203 to conduct the I/O operations to the LBAs. The map module 141 of the controller 11 may also be operable to perform data addressing with variable-sized mapping units to locations in the storage device 15 according to the lookup table 12, and convert LBAs from the host system 202 to block/page addresses directed to the storage device 15.

It should be noted that the embodiments disclosed herein are not limited to any type of storage device 15 as such may be implemented in other persistent storage devices, including HDDs, SSDs, magnetoresistive storage devices, or the like.

What is claimed is:

1. A method, comprising:
    scanning a block of a storage device to identify a failure in a portion of the block;
    suspending input/output (I/O) operations to the failed portion of the block;
    performing garbage collection on the block in response to suspending the I/O operations to the failed portion of the block;
    testing the failed portion of the block to determine if the failure is a transient failure, said testing comprising:
        loading the portion of the block with data;
        reading the data from the loaded portion of the block; and
        determining if the failure remains based on said reading; and
    if the failure subsides after testing, determining that the failure is a transient failure; and
    resuming I/O operations to the portion of the block.

2. The method of claim 1, further comprising:
    retiring the portion of the block if the failure continues.

3. The method of claim 1, wherein:
    the data is test data, I/O data, or a combination thereof.

4. The method of claim 1, further comprising:
    increasing an error correction code (ECC) of the data; and
    retesting the data in the failed portion of the block.

5. The method of claim 1, further comprising:
    determining that the failed portion of the block is a failed page, wherein the failed page is part of a stripe spread across a plurality of blocks of the storage device.

6. The method of claim 1, further comprising:
    determining that the stripe has failed; and
    retiring the stripe in response to the determination that the stripe has failed.

7. A storage system, comprising:
    a storage device comprising a plurality of blocks of memory; and
    a controller operable to scan a first block of the memory to identify a failure in a portion of the first block, to suspend input/output (I/O) operations to the failed portion of the first block, to perform garbage collection on the first block in response to suspending the input/output (I/O) operations to the failed portion of the first block, and to test the failed portion of the first block to determine if the failure is a transient failure,
    said testing comprising loading the portion of the first block with data, reading the data from the loaded portion of the first block, and determining if the failure remains based on said reading, and
    if the failure subsides after testing, the controller is further operable to determine that the failure is a transient failure, and to resume I/O operations to the portion of the first block.

8. The system of claim 7, wherein the controller is further operable to:
    retire the portion of the first block if the failure continues.

9. The system of claim 7, wherein:
    the data is test data, I/O data, or a combination thereof.

10. The system of claim 7, wherein the controller is further operable to:
    increase an error correction code (ECC) of the data; and
    retest the data in the failed portion of the first block.

11. The system of claim 7, wherein the controller is further operable to:
    determine that the failed portion of the first block is a failed page, wherein the failed page is part of a stripe spread across a plurality of blocks of the storage device.

12. The system of claim 7, wherein the controller is further operable to:
    determine that the stripe has failed; and
    retire the stripe in response to the determination that the stripe has failed.

13. A method, comprising:
    scanning a stripe configured across a plurality of storage devices to identify a failure in the stripe, the stripe comprising a plurality of pages of data spread across a plurality of blocks of data;
    suspending input/output (I/O) operations to the stripe;
    performing garbage collection on the stripe in response to suspending the I/O operations to the stripe;
    testing the failed stripe to determine if the failure is within one or more pages of the stripe, said testing comprising:
        XORing the pages of the stripe to determine which of the pages of the stripe have failed;
        performing garbage collection on at least the failed one or more pages of the stripe;
        loading data into the failed one or more pages;
        reading the data from the failed one or more pages of the stripe; and
    if the failure subsides after testing, resuming I/O operations to the stripe.

14. The method of claim 13, further comprising:
    retiring the stripe if the failure continues.

15. The method of claim 13, wherein:
    the data is test data, I/O data, or a combination thereof.

16. The method of claim 13, further comprising:
increasing with an error correction code (ECC) of the data of the one or more failed pages; and
retesting the data in the one or more failed pages.

17. The method of claim 13, wherein:
the one or more storage devices are solid state drives, hard disk drives, or combinations thereof.

\* \* \* \* \*